(12) United States Patent
Lin

(10) Patent No.: US 6,518,511 B1
(45) Date of Patent: Feb. 11, 2003

(54) CIRCUIT BOARD HAVING A SHORTAGE PREVENTING STRUCTURE

(76) Inventor: Wen Hsiung Lin, P.O. Box 10-69, Chong Ho, Taipei (TW), 235

(*) Notice: Subject to any disclaimer, the term of this patent is extended or adjusted under 35 U.S.C. 154(b) by 0 days.

(21) Appl. No.: 09/960,795

(22) Filed: Sep. 20, 2001

(51) Int. Cl.⁷ .................................................. H05R 1/03
(52) U.S. Cl. ...................... 174/256; 174/261; 174/262; 174/265; 361/774; 361/775
(58) Field of Search ................................. 361/774, 775, 361/777; 174/256, 258, 262, 263, 266–268, 72 B

(56) References Cited

U.S. PATENT DOCUMENTS 4,522,449 A * 6/1985 Hayward .................... 361/775
4,664,962 A * 5/1987 DesMarais, Jr. ............. 174/256
5,448,021 A * 9/1995 Arai ............................ 174/250
5,715,595 A * 2/1998 Kman et al. ................. 174/262

* cited by examiner

*Primary Examiner*—Kamand Cuneo
*Assistant Examiner*—Tuan Dinh

(57) ABSTRACT

A circuit board includes a number of orifices, a number of conductors engaged in the orifices of the circuit board and each having an aperture, and an insulating layer applied onto the conductors for preventing a weld metal material from being attached onto the conductors. One or more couplers each includes a bar for securing the prongs together. The weld metal material may be prevented from being applied between the bar and the conductors, for preventing the coupler from being separated from the conductors, and for preventing the prongs from being shortaged.

1 Claim, 2 Drawing Sheets

CIRCUIT BOARD HAVING A SHORTAGE PREVENTING STRUCTURE

BACKGROUND OF THE INVENTION

1. Field of the Invention

The present invention relates to a circuit board, and more particularly to a circuit board having a structure for preventing the coupler or the plug or the conductor pins from being shortaged after welding processes.

2. Description of the Prior Art

Typical circuit boards comprise a number of conductor points or terminals formed or provided therein. The conductor points or terminals each includes a hole formed therein for receiving the legs or the prongs of the couplers or the plugs or the conductor pins, which are then required to be welded to the circuit board by a welding machine and/or with various kinds of welding processes. However, during or after the welding processes, some of the weld metal materials may be attached or filled between the conductor points or terminals of the circuit board and the legs or the prongs of the couplers or the plugs, such that the couplers or the plugs may be slightly separated from the circuit board by the weld metal materials. In some circumstances, the legs or the prongs of the couplers or the plugs may even be electrically coupled together or shortaged by the weld metal materials, after the welding processes, inadvertently.

The present invention has arisen to mitigate and/or obviate the afore-described disadvantages of the conventional circuit boards.

SUMMARY OF THE INVENTION

The primary objective of the present invention is to provide a circuit board including a structure for preventing the coupler or the plug or the conductor pins from being shortaged after welding processes.

In accordance with one aspect of the invention, there is provided a circuit board comprising a circuit board body including a plurality of orifices formed therein, a plurality of conductors engaged in the orifices of the circuit board body respectively, and each including an aperture formed therein, and an insulating layer applied onto the conductors for preventing a weld metal material from being attached onto the conductors, and for preventing the prongs of the coupler from being shortaged by the weld metal material.

The conductors each includes an outer peripheral portion having a peripheral recess formed therein for receiving the circuit board body, and each includes at least one peripheral flange extended radially outward therefrom for forming the peripheral recesses thereof and for engaging with the circuit board body and for solidly securing the conductors in the circuit board body.

The conductors each includes an upper surface, the insulating layer is applied onto the upper surface of the conductors.

One or more couplers are further provided and each includes a bar, and a plurality of prongs secured to the bar for engaging into the apertures of the conductors respectively. The weld metal material may be prevented from being applied or filled onto the conductors or between the bar of the coupler and the conductors, for preventing the coupler from being separated from the conductors of the circuit board body by the weld metal material, or for preventing the prongs of the coupler from being shortaged by the weld metal material.

Further objectives and advantages of the present invention will become apparent from a careful reading of a detailed description provided hereinbelow, with appropriate reference to accompanying drawings.

DETAILED DESCRIPTION OF THE PREFERRED EMBODIMENT

Figure 1:
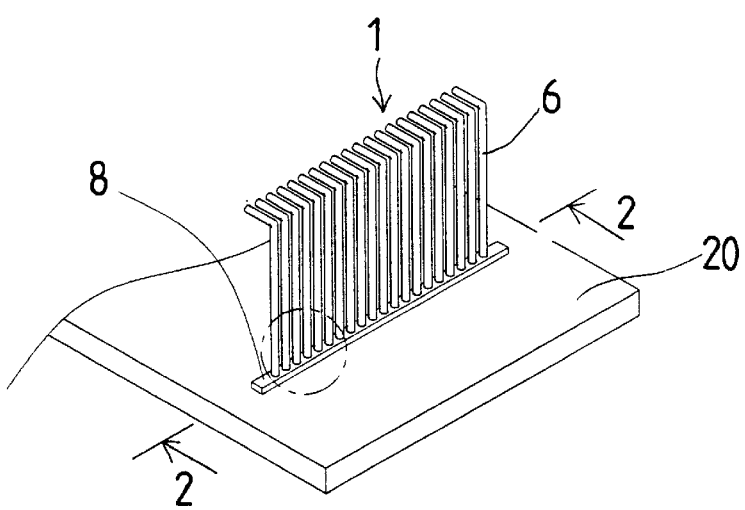
FIG. 1 is partial perspective view of a circuit board in accordance with the present invention.

Referring to the drawings, and initially to FIG. 1, a circuit board in accordance with the present invention comprises a circuit board body 20, and a plug or a coupler 1 including a number of legs or prongs 6 secured together with a bar 8 and to be engaged into and welded to the circuit board body 20 by a welding machine and/or with various kinds of welding processes.

Figure 2:
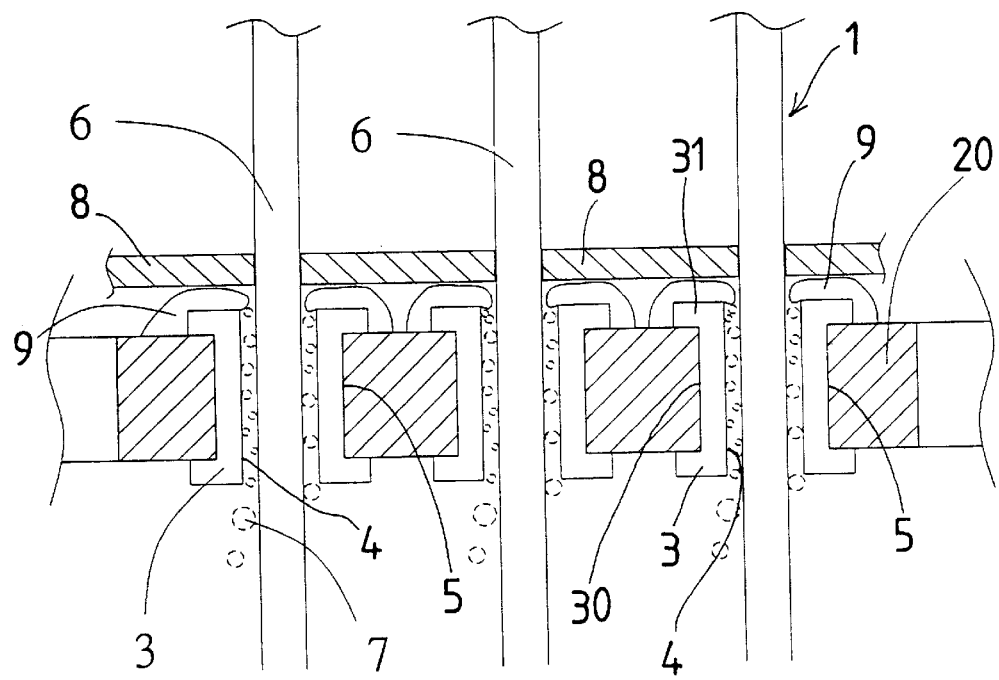
FIG. 2 is a partial cross sectional view taken along lines 2—2 of FIG. 1.
Figure 3:
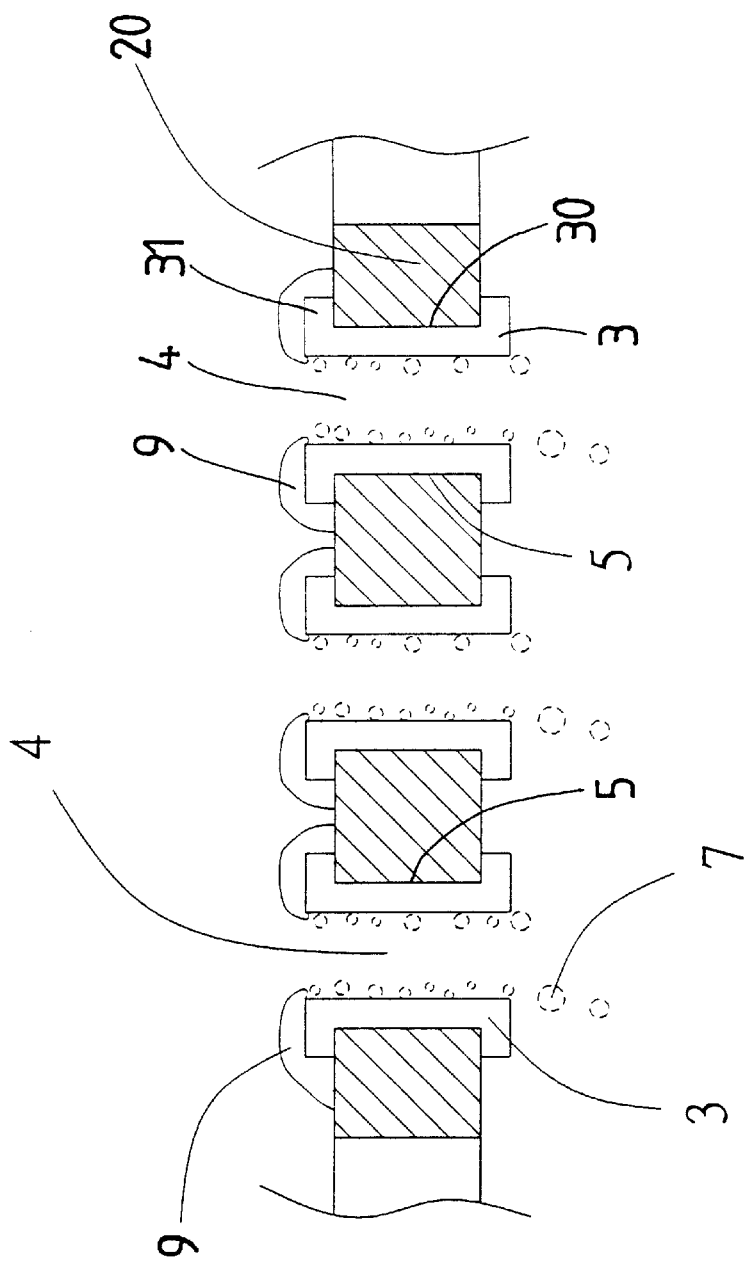
FIG. 3 is a partial cross sectional view similar to FIG. 2, in which the coupler or the plug or the conductor pins have been removed, for illustrating the structure of the circuit board.

Referring next to FIGS. 2 and 3, the circuit board body 20 includes one or more orifices 5 formed therein, and one or more conductor terminals or points 3 or conductors 3 engaged in the orifices 5 of the circuit board body 20 respectively. The conductors 3 are preferably made of copper materials, copper alloys, or the other conductor materials, and each includes an aperture 4 formed therein for receiving the prongs 6 of the coupler 1. The prongs 6 of the coupler 1 will then be secured or welded to the conductors 3 by such as a welding machine, with a weld metal material 7, for example.

The conductors 3 may each include a peripheral recess 30 formed in the outer peripheral portion thereof for receiving the circuit board body 20, and a pair of peripheral flanges 31 extended radially outward therefrom for forming or defining the peripheral recesses 30 thereof and for engaging with the circuit board body 20 and for firmly or solidly securing the conductors 3 in the circuit board body 20.

The circuit board body 20 further includes an insulating film or painting or membrane or layer 9 attached or applied onto the conductors 3 and/or the portions of the circuit board body 20 around the conductors 3. Particularly, the insulating layer 9 is attached or applied onto the upper portions of the upper surfaces of the conductors 3 and/or the contact or adjacent portions of the circuit board body 20 and the conductors 3.

In operation, as shown in FIG. 2, after the prongs 6 of the coupler 1 have been engaged into the apertures 4 of the conductors 3, and during or while welding the prongs 6 of the coupler 1 to the conductors 3 by the welding machine or by the other welding processes, with the weld metal material 7, the insulating layer 9 may prevent the weld metal materials 7 from being attached or applied or filled between the conductors 3 of the circuit board body 20 and the bar 8 of the coupler 1, for preventing the bar 8 of the coupler 1 from being separated from the conductors 3 and the circuit board body 20 by the weld metal materials 7, and for preventing the prongs 6 of the coupler 1 from being shortaged by the weld metal material 7 inadvertently.

Accordingly, the circuit board in accordance with the present invention includes a structure for preventing the coupler or the plug or the conductor pins from being shortaged after welding processes.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A circuit board comprising:

a circuit board body including a plurality of orifices formed therein, a plurality of conductors engaged in said orifices of said circuit board body respectively, and each including an aperture formed therein, an outer peripheral portion having a peripheral recess formed therein for receiving said circuit board body, and at least one peripheral flange extended radial outwardly therefrom for forming said peripheral recesses and for engaging with said circuit board body and for solidly securing said conductors in said circuit board body, at least one coupler including a bar, and a plurality of prongs secured to said bar and engaged into said apertures of said conductors respectively, and arranged for allowing a weld metal material to be engaged between said prongs and said conductors respectively, and an insulating layer applied onto said conductors and provided between said at least one peripheral flange of said conductors and said bar, for preventing the weld metal material from being applied between said bar and said conductors.

* * * * *